United States Patent
Takewaki

(10) Patent No.: US 7,674,704 B2
(45) Date of Patent: Mar. 9, 2010

(54) METHOD OF MANUFACTURING A SEMICONDUCTOR DEVICE HAVING AN INTERCONNECT STRUCTURE THAT INCREASES IN IMPURITY CONCENTRATION AS WIDTH INCREASES

(75) Inventor: Toshiyuki Takewaki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/366,870

(22) Filed: Feb. 6, 2009

(65) Prior Publication Data

US 2009/0149018 A1    Jun. 11, 2009

Related U.S. Application Data

(62) Division of application No. 11/892,707, filed on Aug. 27, 2007, now Pat. No. 7,514,352, which is a division of application No. 10/994,479, filed on Nov. 23, 2004, now Pat. No. 7,274,104.

(30) Foreign Application Priority Data

Nov. 25, 2003    (JP)    ............................. 2003-393726

(51) Int. Cl.
 *H01L 21/4763*    (2006.01)

(52) U.S. Cl. ...................... 438/622; 438/620; 438/618; 438/617; 438/E21.579
(58) Field of Classification Search ......... 438/612–624, 438/637–638, 700; 257/758–760
See application file for complete search history.

(56) References Cited

U.S. PATENT DOCUMENTS

| 6,417,575 | B2 * | 7/2002 | Harada et al. ................ 257/784 |
| 6,433,402 | B1 | 8/2002 | Woo et al. |
| 6,867,136 | B2 * | 3/2005 | Basol et al. .................. 438/687 |
| 6,943,112 | B2 | 9/2005 | Basol et al. |
| 2006/0009033 | A1 * | 1/2006 | Basol et al. .................. 438/674 |

FOREIGN PATENT DOCUMENTS

JP    9-289214    11/1997

* cited by examiner

*Primary Examiner*—Dung A. Le
(74) *Attorney, Agent, or Firm*—Young & Thompson

(57) ABSTRACT

The present invention provides a semiconductor device capable of suppressing an increase in electrical resistance of a narrow interconnect, while keeping reliability of a wide interconnect from being degraded. A semiconductor device comprises a plurality of interconnect layers, and an interconnect in at least one interconnect layer among the plurality of interconnect layers contains an impurity, and the wider the interconnect in the at least one interconnect layer is, the higher concentration of the impurity the interconnect contains.

8 Claims, 10 Drawing Sheets

PRIOR ART

PRIOR ART

US 7,674,704 B2

METHOD OF MANUFACTURING A SEMICONDUCTOR DEVICE HAVING AN INTERCONNECT STRUCTURE THAT INCREASES IN IMPURITY CONCENTRATION AS WIDTH INCREASES

BACKGROUND OF THE INVENTION

1. Field of the Invention

The present invention relates to a semiconductor device including a multilayer interconnect structure, and to a method of manufacturing the same.

2. Description of the Related Art

These years, in the field of semiconductor devices provided with a memory circuit, a logic circuit and the like, an impact of a signal delay to the circuit performance, as well as degradation in reliability of an interconnect due to stress migration (SM) and electromigration (EM) have been focused as a critical issue to be addressed.

A signal delay is considered to take place because of the following two factors. One of the factors is an electrical resistance existing in a long-range interconnect for transmitting a clock signal. For minimizing this problem it is necessary to reduce the electrical resistance of the interconnect, which may be achieved by increasing a thickness of the interconnect, or employing a material having a smaller electrical resistance to constitute the interconnect, for example. The other factor is a parasitic capacitance in a short-range interconnect of a highly integrated pattern such as a memory cell. It is between adjacent interconnects that a parasitic capacitance resultant from micronization of a pattern typically emerges. Such being the case, reducing a parasitic capacitance among interconnects provided in a same layer is effective in minimizing a signal delay caused by the parasitic capacitance.

Based on the foregoing, for a long-range interconnect it is effective to increase a thickness of the interconnect to thereby reduce an electrical resistance of the interconnect, and for a short-range interconnect it is effective to reduce a thickness of the interconnect, to thereby reduce a parasitic capacitance.

Following is a review of an interconnect structure in a conventional semiconductor device. The example described below represents a case where a conductive layer constituting the interconnect is predominantly composed of copper (Cu), which has a lower electrical resistance than aluminum (Al).

FIG. 8 is a schematic cross-sectional view showing a conventional interconnect structure.

As shown in FIG. 8, an underlying silicon oxide layer 2 is provided on a semiconductor substrate 1. A plurality of interconnects is disposed in an interlayer dielectric layer on the underlying silicon oxide layer 2. And the interconnects are mutually connected via a first via plug 52, a second via plug 54, a third via plug 56, a fourth via plug 58, and a fifth via plug 60. A first interconnect 4, a second interconnect 6 and a third interconnect 8 correspond to the short-range interconnect, while a fourth interconnect 10, a fifth interconnect 12 and a sixth interconnect 14 correspond to the long-range interconnect. Here, the long-range interconnect, the short-range interconnect and a via plug are constituted of a pure Cu layer.

Also, as already stated, the long-range interconnects are formed in a greater thickness so as to reduce an electrical resistance existing therein, while the short-range interconnects are made thinner so as to reduce a parasitic capacitance. Accordingly, the long-range interconnects are thicker than the short-range interconnects. Hereinafter, an interconnect having a greater thickness as the long-range interconnect will be referred to as a deep trench interconnect, and an interconnect having a reduced thickness as the short-range interconnect will be referred to as a shallow trench interconnect.

Meanwhile, referring to the degradation in reliability, a known effective countermeasure is employing a Cu alloy layer, which is a Cu layer to which an impurity such as magnesium (Mg), Al, or silicon (Si) has been added, as a material of an interconnect. As a result of employing a Cu alloy layer to constitute an interconnect, the added impurity is deposited at a grain boundary of copper in the interconnect, which increases resistance against the EM caused by an increase in current density.

Now, a multilayer interconnect structure including interconnects to which an impurity has been added will be described.

FIG. 9 is a schematic cross-sectional view showing a multilayer interconnect structure.

As shown in FIG. 9, a first interconnect 20, a second interconnect 22 and a third interconnect 24, which are the short-range interconnects, are made thinner as in FIG. 8, to reduce a parasitic capacitance. Further, these short-range interconnects are constituted of a Cu alloy layer including one selected out of silver, palladium, platinum, tin (Sn), chrome, zirconium and titan, added by CVD (Chemical Vapor Deposition), for preventing the degradation in EM resistance incurred by reducing a thickness of the interconnect (Ref. JP-A Laid Open No. H09-289214) In addition, a fourth interconnect 10, a fifth interconnect 12 and a sixth interconnect 14, which are the long-range interconnects, are constituted of a pure Cu layer, as well as in a greater thickness as in FIG. 8, to reduce an interconnect resistance.

However, in the case of employing a pure Cu layer for constituting the long-range interconnects and the short-range interconnects, when the short-range interconnect is formed in a reduced thickness, a wide interconnect, which has a relatively large width among the short-range interconnects, is also formed in a reduced thickness. A reduced thickness of the interconnect leads to a decrease in free energy in the interconnect bulk. On the other hand, a larger width of an interconnect allows emergence of more free energy on a surface of the interconnect, because of an increase in area of the interconnect pattern. Therefore, as shown in FIG. 10A, in the case where a thickness of a wide interconnect 192 formed in the silicon oxide layer 103 is, for instance, less than 200 nm, the free energy on the interconnect surface becomes greater than that in the interconnect bulk, owing to which an aggregation reaction is prone to be caused by a heat treatment in a subsequent manufacturing process. The aggregation reaction often results in a disconnection in the interconnect, thereby disabling the interconnect. In the case of a narrow interconnect 194, since the free energy on a surface thereof is minor, the aggregation reaction is not likely to take place. Meanwhile, in FIGS. 10A and 10B, the interconnect is provided thereon with a cap layer 196, to serve as a Cu diffusion barrier.

Now referring to SM resistance, at least either of thermal stress because of repeated heat treatments in a manufacturing process (hereinafter referred to as "high-temperature short-term=HTST stress"), or thermal stress imposed by an operational heat during a use of the semiconductor device (hereinafter referred to as "low-temperature long-term=LTLT stress") is prone to incur degradation in the SM resistance. To minimize this problem, it is effective to employ the Cu alloy layer for constituting the interconnect because, as shown in FIG. 10B, an impurity oxide layer 198 is formed on a surface of the interconnect during a cleaning process, following a CMP (Chemical and Mechanical Polishing) process performed to remove an excessive interconnect material on an upper surface of the silicon oxide layer 103, so that the impurity oxide layer 198 covers a surface of the interconnect, to thereby restrain the aggregation reaction that may be caused by a heat treatment.

Also, with a further micronization of the pattern, a grain structure of a narrow interconnect, which is relatively narrower than a wide interconnect, turns to a bamboo structure. In addition, in the case where a barrier metal is provided on a bottom portion and a side wall of the interconnect, a ratio of the barrier metal amount becomes relatively higher with respect to the Cu amount. Accordingly, the problem of the EM can be eliminated. However, adding an impurity to the narrow interconnect often results in causing a signal delay, since a specific resistance of the interconnect is increased. Consequently, it should be concluded that employing a Cu alloy layer having a high concentration of impurity for forming the narrow interconnect is not propriety.

On the other hand, in case of employing a pure Cu layer for forming an interconnect, at least either of the HTST stress or the LTLT stress causes a defect in a grain boundary of the interconnect to move to a junction between the interconnect and a via plug, thereby allowing emergence of a void induced by the stress (hereinafter referred to as a "Stress Induced Void=SIV) at the junction. Since a wide interconnect includes a more number of grain boundaries than a narrow interconnect does, the SIV at the junction grows larger. In case where the junction has a sufficiently large area, an electrical continuity between the wide interconnect and the via plug may still be maintained. However, when the area of the junction is made smaller in compliance with the micronization, it is most probable that an SIV that has grown at the junction causes an open defect, which electrically disconnects the wide interconnect from the via plug.

SUMMARY OF THE INVENTION

The present invention has recognized in view of the foregoing problem, there is provided with a semiconductor device capable of suppressing an increase in electrical resistance of a narrow interconnect, while keeping reliability of a wide interconnect from being degraded, and a method of manufacturing such semiconductor device.

According to the present invention, there is provided a semiconductor device comprising a plurality of interconnect layers; wherein an interconnect in at least one interconnect layer among the plurality of interconnect layers contains an impurity; and the wider the interconnect in the at least one interconnect layer is, the higher concentration of the impurity the interconnect contains.

According to the present invention, the wider an interconnect is, the higher impurity concentration the interconnect contains. Although a wider interconnect is more prone to incur an aggregation reaction because of a heat treatment, such arrangement allows restraining the aggregation reaction, thereby enhancing a resistance against the stress migration caused by the HTST stress. Also, though more defects are included in a wider interconnect, a resistance against the stress migration caused by the LTLT stress can be improved by increasing an impurity concentration, because thereby the impurity is deposited in the defective regions. Consequently, a semiconductor device can be obtained that is capable of suppressing an increase in electrical resistance of a narrow interconnect, while keeping reliability of a wide interconnect from being degraded.

According to the present invention, there is provided a method of manufacturing semiconductor device including an interconnect, comprising forming on a semiconductor substrate an insulating layer in which a wide interconnect trench which is relatively wide, and a narrow interconnect trench which is relatively narrow are formed; forming by a sputtering method a relatively thick alloy layer including a metal containing an impurity in the wide interconnect trench, and a relatively thin alloy layer including a metal containing an impurity in the narrow interconnect trench; forming a metal layer including the same metal as that of the metal layer on both of the alloy layers in the wide interconnect trench and in the narrow interconnect trench; diffusing the impurity from the alloy layer into the metal layer, so as to form a metal layer having a relatively high impurity concentration in the wide interconnect trench, and a metal layer having a relatively low impurity concentration in the narrow interconnect trench; and removing the alloy layer and the metal layer formed in an external region of the respective interconnect trenches, so as to form a relatively wide interconnect in the wide interconnect trench and a relatively narrow interconnect in the narrow interconnect trench, so as to constitute a first interconnect.

According to the present invention, since a sputtering method is employed to form an alloy layer, a thickness of the alloy layer formed in an interconnect trench increases, the wider the interconnect in the interconnect trench is. Therefore, the wider interconnect formed in the relatively wide interconnect trench obtains a higher impurity concentration than does the narrow interconnect formed in the relatively narrow interconnect trench. This allows restraining an aggregation reaction, and suppressing a growth of a void originating from a defect in the interconnect. Consequently, such method of manufacturing provides a semiconductor device capable of suppressing an increase in electrical resistance of a narrow interconnect, while keeping reliability of a wide interconnect from being degraded.

According to the present invention, there is provided a method of manufacturing semiconductor device including an interconnect, comprising forming on a semiconductor substrate an insulating layer in which a wide interconnect trench which is relatively wide and a narrow interconnect trench which is relatively narrow are formed; forming a first metal layer in the wide interconnect trench and in the narrow interconnect trench; forming by an electrolytic plating method a second metal layer including the same metal as that of the first metal layer, in a relatively small thickness in the wide interconnect trench and in a relatively great thickness in the narrow interconnect trench; forming an alloy layer including the same metal as that of the second metal layer and containing an impurity by a sputtering method on the second metal layer in the wide interconnect trench and in the narrow interconnect trench; diffusing the impurity from the alloy layer into the metal layer, so as to form a metal layer having a relatively high impurity concentration in the wide interconnect trench, and a metal layer having a relatively low impurity concentration in the narrow interconnect trench; and removing the alloy layer and the metal layer formed in an external region of the respective interconnect trenches, so as to form a relatively wide interconnect in the wide interconnect trench and a relatively narrow interconnect in the narrow interconnect trench, so as to constitute a first interconnect.

According to the present invention, a second metal layer is formed by an electrolytic plating method in an interconnect trench, in a relatively small thickness in the wide interconnect trench, and in a relatively great thickness in the narrow interconnect trench, after which a sputtering method is employed to form an alloy layer including an impurity, so as to fill a remaining portion of the interconnect trenches. Therefore, a value obtained by dividing a thickness of the alloy layer in the wide interconnect trench by a thickness of the second metal layer is relatively greater than a value obtained by dividing a thickness of the alloy layer in the narrow interconnect trench by a thickness of the second metal layer. Accordingly, a concentration of the impurity diffused in the metal layer in the wide interconnect trench is relatively higher than a concentration of the impurity diffused in the metal layer in the narrow interconnect trench. In other words, the wide interconnect has a higher impurity concentration, because of which an aggregation reaction can be restrained, and a growth of a void originating from a defect in the interconnect can be suppressed Consequently, such method of manufacturing provides a semiconductor device capable of suppressing an increase in electrical resistance of a narrow interconnect, while keeping reliability of a wide interconnect from being degraded.

As described above, the present invention enables restraining an impurity concentration at a low level in a narrow interconnect where an electrical resistance of the interconnect is prone to increase, while increasing an impurity concentration in a wide interconnect where the open defect of a via plug is prone to be incurred because of Cu aggregation and the SIV, caused by a heat cycle during the manufacturing process. Consequently, there is provided a semiconductor device capable of suppressing an increase in electrical resistance of a narrow interconnect, and keeping reliability of a via plug from being degraded by the LTLT stress imposed on the wide interconnect region, as well as a method of manufacturing such semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
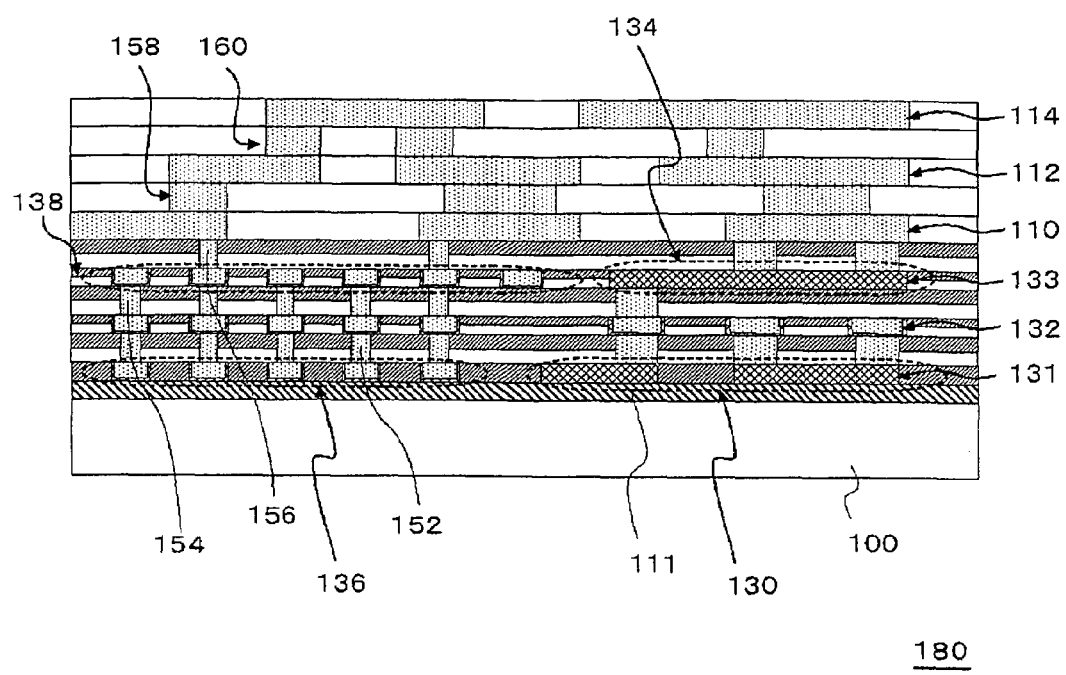
FIG. 1 is a schematic cross-sectional view showing a structure of a semiconductor device according to a first embodiment of the present invention.

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor device according to the present invention is designed such that, with respect to a multilayer interconnect structure, an alloy layer containing an impurity is employed as a material for an interconnect in a shallow trench, and the wider the interconnect is the higher impurity concentration the interconnect contains.

According to the present invention, there is provided a method of manufacturing a semiconductor device including an interconnect, comprising forming on a semiconductor substrate an insulating layer in which an interconnect trench is disposed; forming an alloy layer including a metal containing an impurity by a sputtering method in the interconnect trench; forming a metal layer including the same metal as that of the metal layer by an electrolytic plating method on the alloy layer; diffusing the impurity in the interconnect trench by a heat treatment to granulate the metal; and removing the alloy layer and the metal layer on the insulating layer, so as to form a first interconnect.

According to the present invention, since a sputtering method is employed to form an alloy layer, a thickness of the alloy layer formed in an interconnect trench increases, the wider the interconnect in the interconnect trench is. Therefore, the wider the interconnect is, the higher impurity concentration the interconnect obtains, because of which an aggregation reaction can be restrained, and a growth of a void originating from a defect in the interconnect can be suppressed. Consequently, such method of manufacturing provides a semiconductor device capable of suppressing an increase in electrical resistance of a narrow interconnect, while keeping reliability of a wide interconnect from being degraded.

According to the present invention, there is provided a method of manufacturing a semiconductor device including an interconnect, comprising forming on a semiconductor substrate an insulating layer in which an interconnect trench is formed; forming a metal layer by a sputtering method in the interconnect trench; forming a metal layer including the same metal as that of the metal layer by an electrolytic plating method in the interconnect trench; forming an alloy layer including the same metal as that of the metal layer and containing an impurity, by a sputtering method on the metal layer; diffusing the impurity in the interconnect trench by a heat treatment to granulate the metals; and removing the metal layer and the alloy layer on the insulating layer, so as to form a first interconnect.

According to the present invention, a metal layer is formed by an electrolytic plating method in an interconnect trench, after which a sputtering method is employed to form an alloy layer, so as to fill a remaining portion of the interconnect trench. Therefore, a thickness of the alloy layer increases, the wider the interconnect in the interconnect trench is. In other words, the wider the interconnect is the higher impurity concentration the interconnect obtains, because of which an aggregation reaction can be restrained, and a growth of a void originating from a defect in the interconnect can be suppressed. Consequently, such method of manufacturing provides a semiconductor device capable of suppressing an increase in electrical resistance of a narrow interconnect, while keeping reliability of a wide interconnect from being degraded.

Alternatively, in the semiconductor device according to the present invention, the plurality of interconnect layers may include a lower interconnect layer including a shallow trench interconnect and an upper interconnect layer including a deep trench interconnect, such that an interconnect in the at least one interconnect layer among the plurality of layers is included in the lower interconnect layer, and an interconnect in the upper interconnect layer is constituted of a metal that does not contain an impurity.

Also, in the semiconductor device according to the present invention, an interconnect in the at least one interconnect layer among the plurality of interconnect layers may include a wide interconnect having a thickness thinner than a width thereof, and a narrow interconnect having a thickness equal to or greater than a width thereof.

According to the present invention, in the wide interconnect having an aspect ratio, i.e. a ratio of a thickness of the interconnect against a width thereof, of less than 1, in other words having a greater width than a thickness thereof, an aggregation reaction is restrained, and a growth of a void which increases in proportion to a width of the interconnect can be suppressed.

Also, in the semiconductor device according to the present invention, an interconnect in the at least one interconnect layer among the plurality of interconnect layers may have a thickness of 400 nm or less. Such configuration further may increase a restraining effect of the aggregation reaction, which is most likely to take place when the interconnect is 400 nm or less in thickness.

Further, in the semiconductor device according to the present invention, the wide interconnect may contain the impurity in a concentration of 0.1 to 10 atomic %, and an interconnect in the at least one interconnect layer among the plurality of interconnect layers may be predominantly composed of copper, while the impurity may be an element having a lower standard electrode potential than copper.

Referring to a method of manufacturing a semiconductor device according to the present invention, the method may further include forming on the first interconnect an interlayer dielectric layer in which an opening for a via plug is formed; filling the opening for a via plug with a first conductive layer so as to form a via plug; forming an interlayer dielectric layer in which a second interconnect trench connected to the via plug is provided; and filling the second interconnect trench with a second conductive layer so as to form a second interconnect.

According to the present invention, the via plug and the second interconnect are independently formed on the first interconnect. Therefore, a different material may be employed for each of the via plug and the second interconnect.

Also, in the method of manufacturing a semiconductor device according to the present invention, the first conductive layer may be constituted of one selected out of a group consisting of copper containing an impurity other than copper, copper, tungsten, and aluminum.

Also, the method of manufacturing a semiconductor device according to the present invention may further include forming on the first interconnect an interlayer dielectric layer in which an opening for a via plug is formed and a second interconnect trench connected to the opening for a via plug is formed; and filling the opening for a via plug and the second interconnect trench with a conductive layer, so as to form a via plug and a second interconnect.

According to the present invention, since the via plug and the second interconnect are simultaneously formed on the first interconnect, a manufacturing process can be shortened.

Further, in the method of manufacturing a semiconductor device according to the present invention, the metal may be copper, and the method may further include forming a third interconnect constituted of the metal not containing an impurity, on the first interconnect.

Hereunder, embodiments of the present invention will be described referring to the accompanying drawings. In all the drawings, same constituents are given an identical numeral, and a description thereof may be omitted as the case may be. Here, description on semiconductor elements such as a transistor or a condenser, as well as on a method of manufacturing the same will also be omitted, since they are similar to those already known.

First Embodiment

FIG. 1 is a schematic cross-sectional view showing a structure of a semiconductor device according to the present embodiment.

As shown in FIG. 1, the semiconductor device 180 has a multilayer interconnect structure, in which a plurality of interconnect layers (a plurality of shallow trench interconnects, which are lower interconnect layer, and a plurality of deep trench interconnects, which are upper interconnect layer) is provided on an underlying silicon oxide layer 111, which is interlayer dielectric layer, formed on a semiconductor substrate 100. The shallow trench interconnects and the deep trench interconnects are connected to one another via a first via plug 152, a second via plug 154, a third via plug 156, a fourth via plug 158, and a fifth via plug 160.

In this embodiment, a first interconnect 131, a second interconnect 132 and a third interconnect 133, which are shallow trench interconnects, are constituted of a Cu—Al alloy (hereinafter simply referred to as a Cu alloy) layer, composed of Cu layer containing Al as an impurity. And an impurity concentration in a Cu alloy interconnect constituted of the Cu alloy layer is made higher, the wider the interconnect is. For example, in the first interconnect 131 in FIG. 1, a wide interconnect 130 has a higher impurity concentration than a narrow interconnect 136 does. Likewise, in the third interconnect 133, a wide interconnect 134 has a higher impurity concentration than a narrow interconnect 138 does. Here, the wide interconnect 130 is relatively wider than the narrow interconnect 136, and the wide interconnect 134 is relatively wider than the narrow interconnect 138.

Meanwhile, in this embodiment a pure Cu layer not containing an impurity is employed as a material irrespective of a width thereof for deep trench interconnects, namely a fourth interconnect 110, a fifth interconnect 112 and a sixth interconnect 114, as in a conventional structure.

A method of manufacturing the foregoing semiconductor device will now be described. The following passages refer to a manufacturing process of the first interconnect through the third interconnect.

FIGS. 2A through 5B are schematic cross-sectional views stepwisely showing a method of manufacturing the foregoing semiconductor device.

Figure 2A:
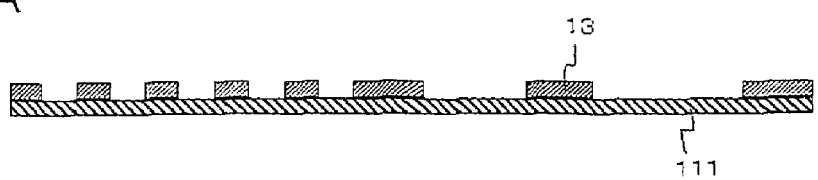
FIGS. 2A to 2E are schematic cross-sectional views stepwisely showing a method of manufacturing the semiconductor device according to the first embodiment.

After forming semiconductor elements such as a transistor on a semiconductor substrate (not shown in the drawings), an underlying silicon oxide layer 111 is formed. Referring to FIG. 2A, a silicon oxide layer 13 is formed on the underlying silicon oxide layer 111 to serve as an interlayer dielectric layer, and a resist pattern is provided by a known lithography technique. Then a dry etching is performed on the resist pattern so as to form an interconnect trench in a depth of 200 nm in the silicon oxide layer 13, after which the resist pattern is removed. At this stage, two kinds of interconnect trenches are formed, namely a narrow interconnect trench of 0.1 μm in width for constituting a narrow interconnect, and a wide interconnect trench of 1.0 µm in width for constituting a wide interconnect.

Figure 2B:
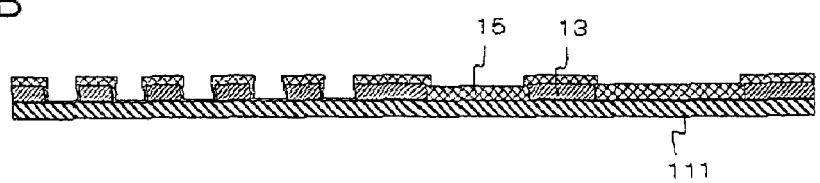

Referring then to FIG. 2B, a TaN layer and a Ta layer are sequentially formed by a sputtering method in a thickness of 10 nm and 20 nm respectively, on both of the wide interconnect trench and the narrow interconnect trench, so as to form a Ta/TaN stacked layer, which is to serve as a barrier metal layer (not shown in the drawings). After that, a sputtering method is again performed to form a Cu alloy layer containing an impurity in a thickness of 60 nm, which is to serve as a seed layer 15, on both of the wide interconnect trench and the narrow interconnect trench. Here, an impurity concentration (Al) in the Cu alloy layer is 0.5 wt % in this embodiment.

At this stage, a thickness of the seed layer 15 in the interconnect trenches is approx. 60 cm on a bottom portion and a side wall of the wide interconnect trench. By contrast, in the narrow interconnect trench a thickness of the seed layer 15 is approx. 5 nm on a bottom portion thereof, and approx. 2 nm on a side wall thereof. As is apparent, the seed layer 15 formed in the wide interconnect trench is relatively thicker than the seed layer 15 formed in the narrow interconnect trench. Here, such difference in thickness depending on a width of the interconnect originates from a difference of a step coverage. An index that designates the step coverage is the aspect ratio of an interconnect trench, which stands for a ratio of a thickness of an interconnect against a width thereof (interconnect depth/interconnect width). The greater the aspect ratio is, the thinner the Cu alloy layer 15 becomes on a bottom portion and a side wall of an interconnect trench (shadowing effect). Herein, an interconnect having an aspect ratio of less than 1 will be referred to as the wide interconnect, and one having an aspect ratio of 1 or greater will be referred to as the narrow interconnect in this embodiment.

Also, referring to the sputtering method, setting a gas pressure for striking out atoms from a target containing an interconnect material in a processing chamber at a higher level facilitates the atoms to better disperse to form a film, resulting in formation of a thinner Cu alloy layer on a bottom portion and a side wall of the interconnect trench. Accordingly, when performing a sputtering method, a thickness of the seed layer 15 to be formed in the interconnect trench may be controlled by adjusting the gas pressure.

Figure 2C:
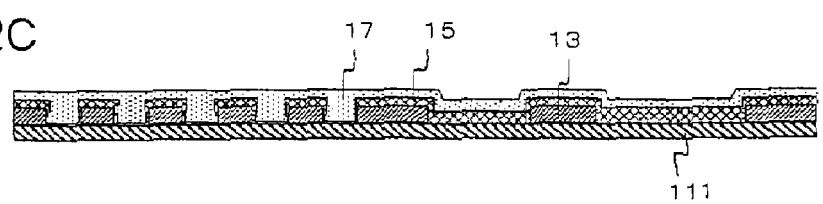
Figure 2D:
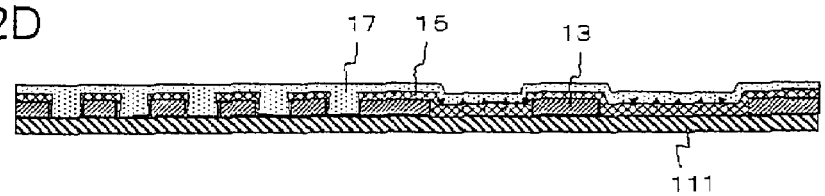

Proceeding to FIG. 2C, after forming a Cu layer 17, which is metal layer, in a thickness of 600 nm by an electrolytic plating method on both of the wide interconnect trench and the narrow interconnect trench, a heat treatment is performed in a nitrogen atmosphere at 350 degree centigrade for 30 minutes, to granulate the metals (FIG. 2D). In this process, Al, which is an impurity for the Cu layer, diffuses out of the seed layer 15 into the Cu layer as shown by arrows in FIG. 2D. An Al impurity concentration in an interconnect depends on a thickness of the seed layer 15 formed in the corresponding interconnect trench. Therefore, the Al impurity concentration becomes relatively higher in the Cu layer 17 in the wide interconnect trench where the seed layer 15 is relatively thicker, than in the Cu layer 17 in the narrow interconnect trench where the seed layer 15 is relatively thinner. In this embodiment for example, the Al impurity concentration has proved to be approx. 0.015 wt % in the narrow interconnect, and approx. 0.18 wt % in the wide interconnect. Accordingly, it has been proven that there is a difference greater than an order of magnitude in Al impurity concentration between the narrow interconnect and the wide interconnect.

Figure 2E:
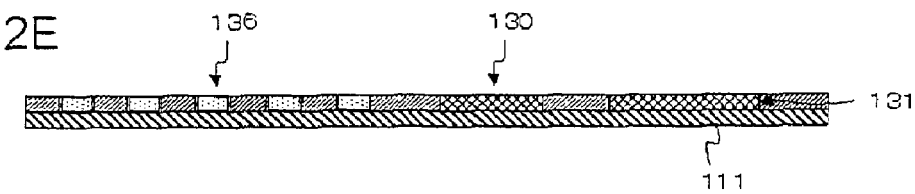

Now referring to FIG. 2E, a CMP process is performed to remove the interconnect materials (the seed layer 15 and the Cu layer 17—hence such CMP will hereinafter be referred to as "Cu-CMP process) located on an upper surface of the silicon oxide layer 13 except on the interconnect trenches, so as to form the narrow interconnect 136 which is relatively narrow and the wide interconnect 130 which is relatively wide, in a depth of approx. 200 nm. At this stage, formation of the first interconnect 131, which is first interconnect layer, has been completed. Here, an Al impurity concentration of the wide interconnect 130 is relatively higher than that of the narrow interconnect 136.

In addition, a grain status in the interconnects after the Cu-CMP process has actually been observed, the result of which is as follows. For the observation, an EBSP (Electron Back Scattering Pattern) was employed. The grain size has proved to be 0.2 µm irrespective of a difference in width among the interconnects. While a bamboo structure has been achieved in the narrow interconnect 136, numerous grain boundaries have been observed in the wide interconnect 130.

Figure 3A:
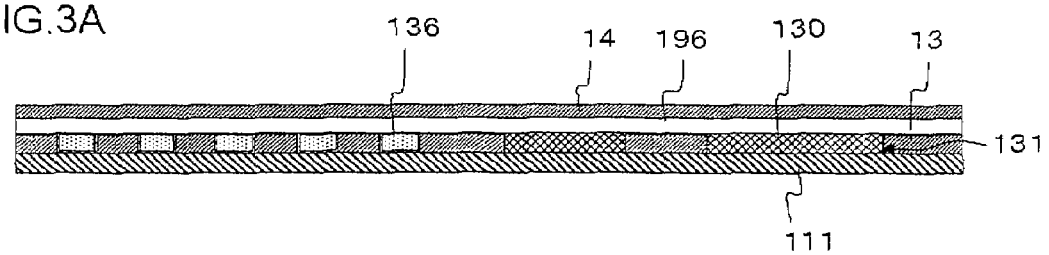
FIGS. 3A to 3C are schematic cross-sectional views stepwisely showing a method of manufacturing the semiconductor device according to the first embodiment.
Figure 3B:
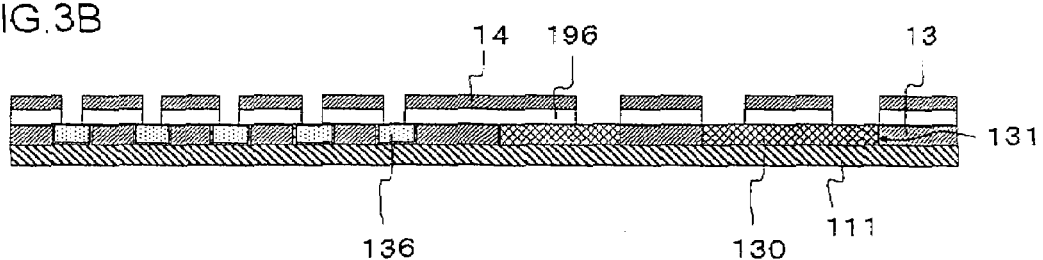
Figure 3C:
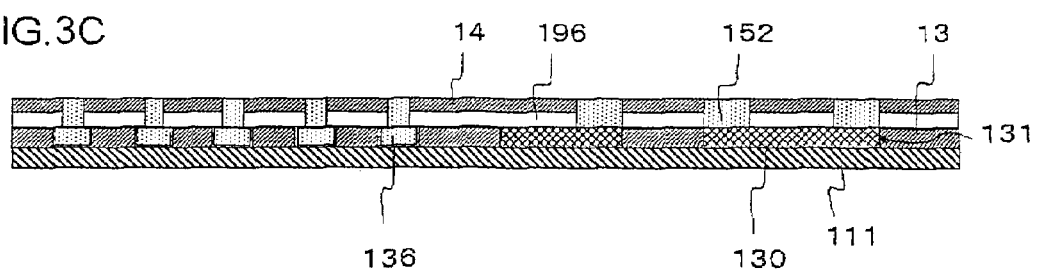
Figure 4A:
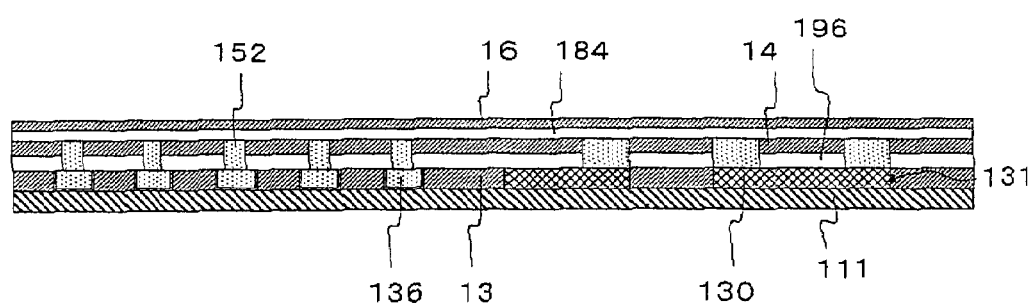
FIGS. 4A and 4B are schematic cross-sectional views stepwisely showing a method of manufacturing the semiconductor device according to the first embodiment.
Figure 4B:
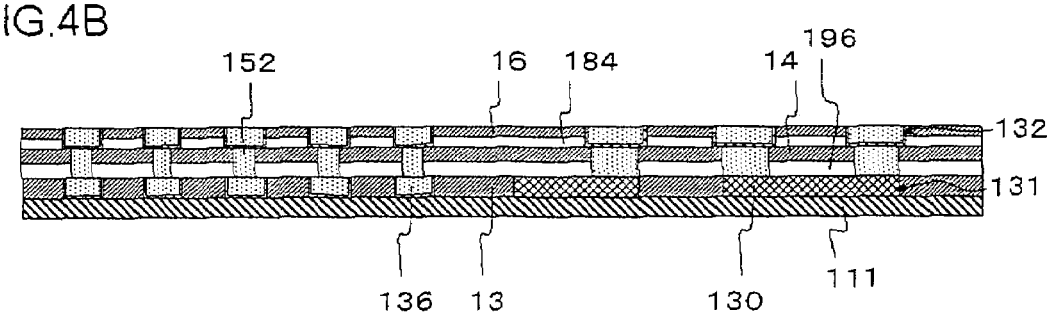
Figure 5A:
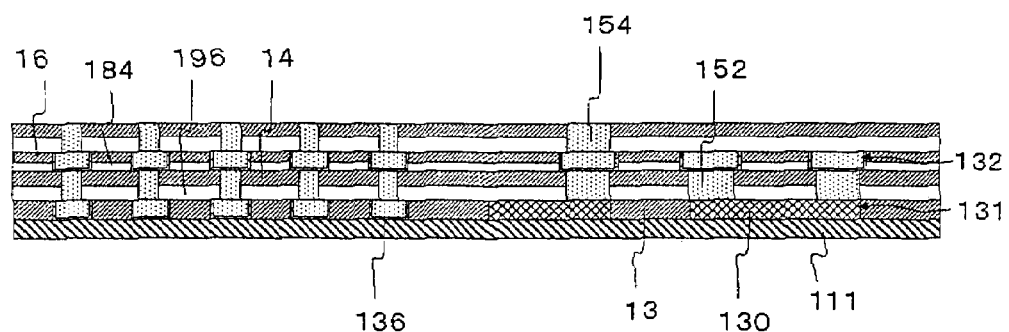
FIGS. 5A and 5B are schematic cross-sectional views stepwisely showing a method of manufacturing the semiconductor device according to the first embodiment.
Figure 5B:
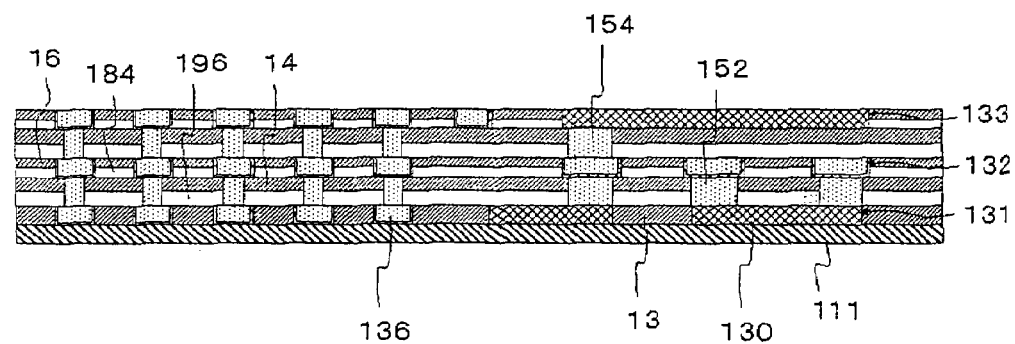

After the Cu-CMP process, a cap layer 196 is formed on the interconnects for inhibiting Cu diffusion, and a silicon oxide layer 14 is formed, which is to serve as an interlayer dielectric layer (FIG. 3A). Then, an opening 182 for a via plug is formed in the interlayer dielectric layer by a known lithography and an etching process (FIG. 3B). After filling the opening 182 for a via plug with a Cu layer, the Cu layer on the interlayer dielectric layer is removed by a CMP, to thereby form the first via plug 152 shown in FIG. 1 (FIG. 3C). Further, after forming a cap layer 184, a silicon oxide layer 16 is formed, which is to serve as an interlayer dielectric layer for forming the second interconnect 132, which is second interconnect layer, shown in FIG. 1 (FIG. 4A). The second interconnect 132 may be formed through similar steps to those for forming the first interconnect 131 (FIG. 4B). Thereafter, repeating the formation of the interconnect and the via plug leads to formation of a multilayer structure in the shallow trench interconnect region. For example, the second via plug 154 may be formed on the second interconnect 132 as shown in FIG. 5A, and the third interconnect 133 (third interconnect layer) may be formed on the second via plug 154, as shown in FIG. 5B. Meanwhile, since a conventional structure may be employed to form a multilayer structure in the deep trench interconnect region, description on a formation method thereof will be omitted.

The foregoing process provides the semiconductor device 180.

Now the advantages of this embodiment will be described hereunder.

As stated in the preceding passages in this embodiment, as a result of employing a sputtering method to form a Cu alloy layer which serves as the seed layer 15, the seed layer 15 is thinly formed in the narrow interconnect but thickly formed in the wide interconnect because of the shadowing effect, thus producing a difference in thickness between the narrow interconnect and the wide interconnect. Therefore, when the Cu layer 17 is formed on the seed layer 15 by an electrolytic plating method and a heat treatment is performed for granulation, an impurity in the seed layer 15 diffuses into the Cu layer 17, thereby granting a higher impurity concentration to the wide interconnect than to the narrow interconnect, once the formation of the interconnects has been completed. Accordingly, an increase in electrical resistance of the narrow interconnect can be restrained, while an impurity concentration in the wide interconnect can be increased. Consequently, an aggregation reaction due to a heat treatment can be restrained, which increases a resistance against the stress migration (SM resistance) caused by the HTST stress. Also, since the impurity is deposited in the grain boundary, a resistance against the stress migration (SM resistance) caused by the LTLT stress of the wide interconnect can be increased.

As far as the deep trench interconnect region is concerned, an increase in electrical resistance of an interconnect can be suppressed just by employing a conventional structure.

While an electrolytic plating method is employed to form the Cu layer 17 on the seed layer 15 in this embodiment, a different method may be employed for forming the Cu layer.

Second Embodiment

A method of manufacturing a semiconductor device according to the second embodiment basically includes forming a Cu layer by an electrolytic plating method, and then forming a Cu alloy layer containing an impurity by a sputtering method, to thereby diffuse the impurity in a shallow trench interconnect.

FIGS. 6A to 7B are schematic cross-sectional views stepwisely showing a method of manufacturing a semiconductor device according to a second embodiment.

Figure 6A:
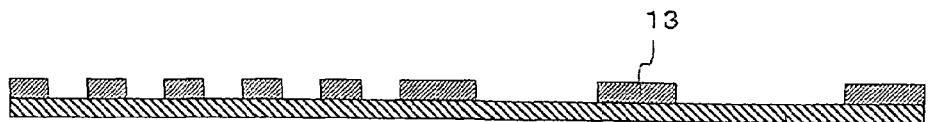
FIGS. 6A to 6F are schematic cross-sectional views stepwisely showing a method of manufacturing a semiconductor device according to a second embodiment.

After forming semiconductor elements (not shown in the drawings) such as a transistor on a semiconductor substrate (not shown in the drawings), an underlying silicon oxide layer 111 is formed. Similarly to the first embodiment, a silicon oxide layer 13 is formed on the underlying silicon oxide layer 111 to serve as an interlayer dielectric layer, and an interconnect trench is formed in a depth of 200 nm in the silicon oxide layer 13 (FIG. 6A). As shown in FIG. 6A, two kinds of interconnect trenches are provided, namely a narrow interconnect trench of 0.1 μm in width for constituting a narrow interconnect, and a wide interconnect trench of 1.0 μm in width for constituting a wide interconnect. Here, the wide interconnect is relatively wider than the narrow interconnect.

Figure 6B:
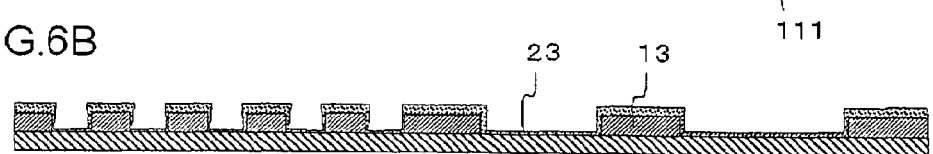

Referring then to FIG. 6B, a TaN layer and a Ta layer are sequentially formed by a sputtering method in a thickness of 10 nm and 20 nm respectively, on both of the wide interconnect trench and the narrow interconnect trench, so as to form a Ta/TaN stacked layer, which is to serve as a barrier metal layer (not shown in the drawings). After that, a pure Cu layer is formed in a thickness of 60 nm by a sputtering method, which is to serve as a seed layer 23 (first metal layer), on both of the wide interconnect trench and the narrow interconnect trench.

Figure 6C:
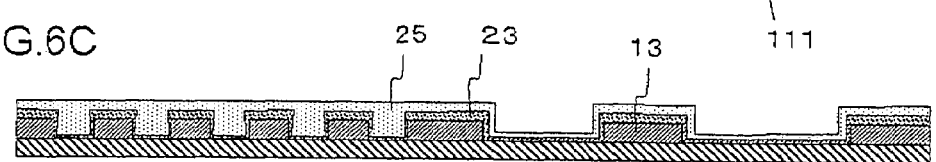

Proceeding to FIG. 6C, a Cu layer 25, which is second metal layer, is formed in a thickness of 100 nm by an electrolytic plating method, under a plating condition that urges a bottom-up growth. At this stage, while the Cu layer 25 completely fills the interconnect trench for the narrow interconnect, the Cu layer 25 does not fill an entire part of the interconnect trench for the wide interconnect. In other words, the Cu layer 25 is relatively thinly formed in the wide interconnect trench, but relatively thickly formed in the narrow interconnect trench.

Figure 6D:
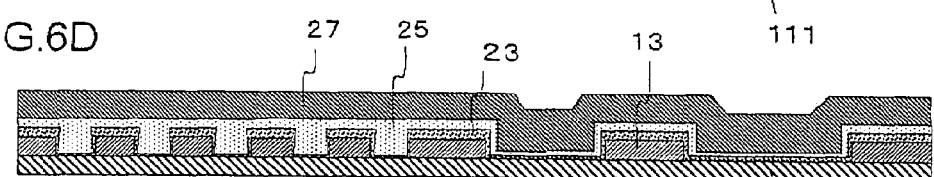
Figure 6E:
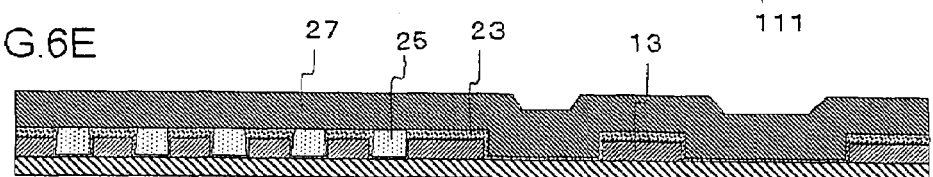

Then referring to FIG. 6D, a Cu alloy layer 27, which is alloy layer, containing 0.5 wt % of Al as an impurity is formed on the Cu layer 25 by a sputtering method, in a thickness of 500 nm, after which a heat treatment is performed in a nitrogen atmosphere at 350 degree centigrade for 30 minutes, to granulate the metals. In this process, the Al which is the impurity diffuses out of the Cu alloy layer 27 into the Cu layer 25, as shown in FIG. 6E. In this embodiment, the Al impurity concentration has proved to be approx. 0.0015 wt % in the narrow interconnect, and approx. 0.25 wt % in the wide interconnect. Accordingly, it has been proven that there is a difference greater than a couple of orders of magnitude in Al impurity concentration between the narrow interconnect and the wide interconnect, and that a Cu layer having a relatively high Al impurity concentration is formed in the wide interconnect trench, while a Cu layer having a relatively low Al impurity concentration is formed in the narrow interconnect trench.

Figure 6F:
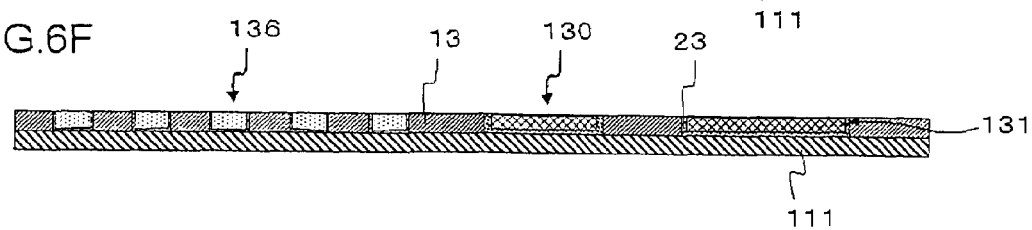

Now referring to FIG. 6F, a Cu-CMP process is performed to remove the interconnect materials (the seed layer 23 and the Cu layer 27) located on an upper surface of the silicon oxide layer 13 except on the interconnect trenches, so as to form the narrow interconnect 136 which is relatively narrow and the wide interconnect 130 which is relatively wide, in a depth of approx. 200 nm. At this stage, formation of the first interconnect 131, which is first interconnect layer, has been completed.

In addition, a grain status in the interconnects after the Cu-CMP process has actually been observed, the result of which is as follows. For the observation, an EBSP (Electron Back Scattering Pattern) was employed. The grain size has proved to be 0.2 μm irrespective of a difference in width among the interconnects. While a bamboo structure has been achieved in the narrow interconnect 136, numerous grain boundaries have been observed in the wide interconnect 130.

Figure 7A:
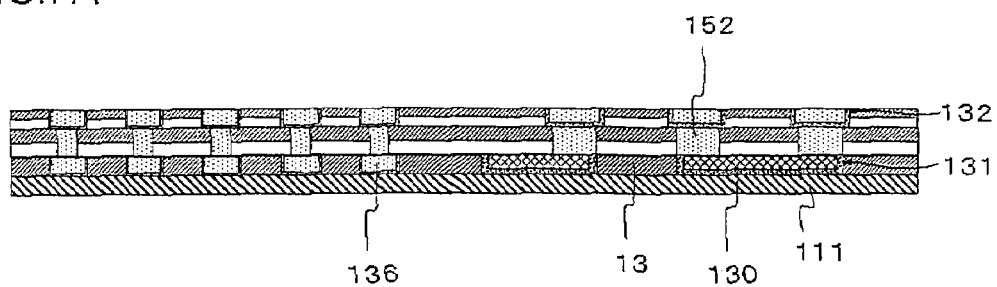
FIGS. 7A and 7B are schematic cross-sectional views stepwisely showing a method of manufacturing the semiconductor device according to the second embodiment.
Figure 7B:
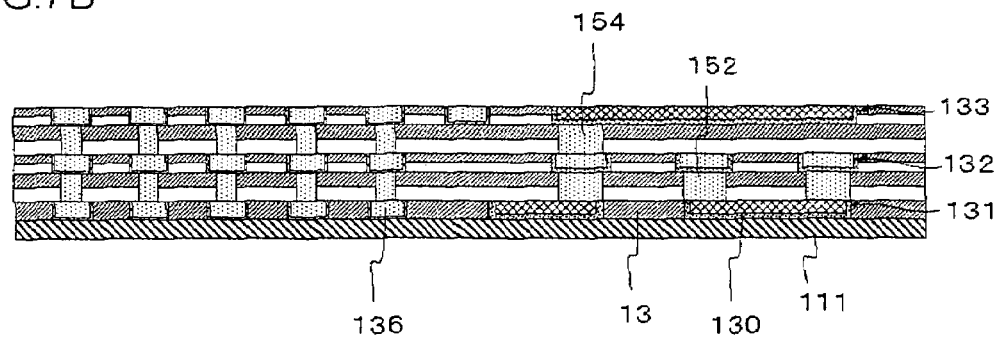
Figure 8:
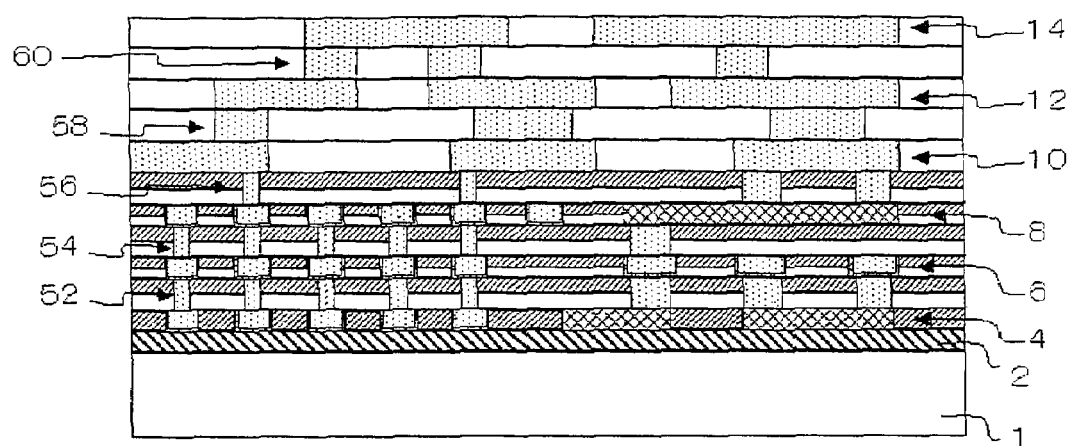
FIG. 8 is a schematic cross-sectional view showing a structure of a conventional semiconductor device.
Figure 9:
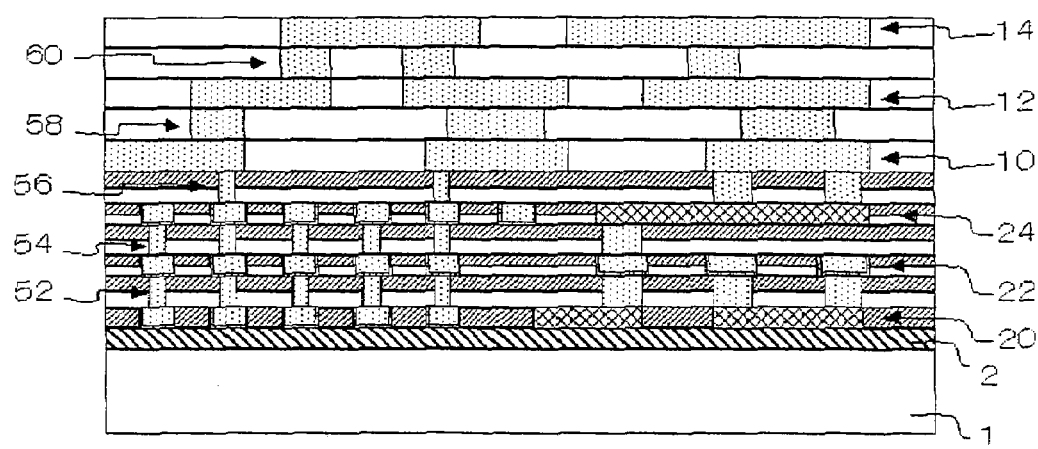
FIG. 9 is a schematic cross-sectional view showing a structure of another conventional semiconductor device.

After the Cu-CMP process, a cap layer is formed on the interconnects for inhibiting Cu diffusion, and a multilayer structure is formed in the shallow trench interconnect region through similar steps to those of the first embodiment. For example, the first via plug 152 and the second interconnect 132, which is second interconnect layer, may be formed on the first interconnect 131 as shown in FIG. 7A, and the second via plug 154 and the third interconnect 133, which is third interconnect layer, may be formed on the second interconnect 132, as shown in FIG. 7B. Meanwhile, since a conventional structure may be employed to form a multilayer structure in the deep trench interconnect region, description on a formation method thereof will be omitted.

The foregoing process provides the semiconductor device.

Now the advantages of this embodiment will be described hereunder.

As stated in the preceding passages in this embodiment, after the sputtering process for forming a pure Cu layer which serves as the seed layer 23, an electrolytic plating is performed to form a Cu layer. Here, while the interconnect trench for the narrow interconnect is completely filled with Cu, the interconnect trench for the wide interconnect is only halfway filled. Then the Cu alloy layer 27 is formed by a sputtering method. Accordingly, while the interconnect trench for the narrow interconnect has already been filled with the Cu provided by the electrolytic plating, the Cu alloy layer 27 provided through the sputtering process is utilized to fill a remaining portion of the interconnect trench for the wide interconnect, which has been only halfway filled, so as to completely fill the wide interconnect trench. Because of such structure, when the heat treatment is performed to granulate the metals, more amount of impurity diffuses into the wide interconnect, thereby granting a higher impurity concentration to the wide interconnect than the narrow interconnect. Therefore, an increase in electrical resistance of the narrow interconnect can be restrained, while an impurity concentration of the wide interconnect can be increased. Consequently, on the part of the wide interconnect an aggregation reaction due to a heat treatment can be restrained, which increases a resistance against the stress migration (SM resistance) caused by the HTST stress. Also, since the impurity is deposited in the grain boundary, a resistance against the stress migration (SM resistance) caused by the LTLT stress of the wide interconnect can be increased.

While a sputtering method is employed to form a pure Cu layer which is to serve as the seed layer 23 in the second embodiment, the pure Cu layer may be formed by a different method, such as a plating method.

Although the preferable embodiments of the present invention have been described referring to the accompanying drawings, it is to be understood that these embodiments are only exemplary, and that various other constitutions may be employed.

To cite a few examples, while the shallow trench interconnect is formed in a thickness of 200 nm in the first embodiment and the second embodiment, a thickness of the shallow trench interconnect is not limited to this value. However, when a thickness of the shallow trench interconnect is 400 nm or less, an aggregation reaction is more readily caused by a thermal stress, and hence the advantage of the present invention is more prominently exhibited.

Also, while the foregoing embodiment is based on a single Damascene process by which the first via plug 152 and the second interconnect 132 are independently formed, a dual Damascene process may be employed so as to integrally form the first via plug and the second interconnect. In the case of employing the single Damascene process, a different material can be utilized to constitute the via plug and the second interconnect. In the case of the dual Damascene process, the steps may include forming an opening for a via plug and the second interconnect trench connected to the opening for a via plug in the interlayer dielectric layer on the first interconnect, filling the opening for a via plug and the second interconnect trench with a metal layer, and removing the metal layer on the interlayer dielectric layer by a CMP process, so as to form the first via plug and the second interconnect. Also, the dual Damascene process allows shortening a manufacturing process.

Also, the single Damascene process and the dual Damascene process may be employed in combination, to form a plurality of interconnects and via plugs. Further, a structure of the shallow trench interconnect and the deep trench interconnect is not limited to three layers. In the case of forming a via plug by a single Damascene process, the via plug may be constituted of one selected out of the group consisting of tungsten (W), Al and a Cu alloy, which is copper containing an impurity other than copper, in addition to Cu as a conductive material.

Figure 10A:
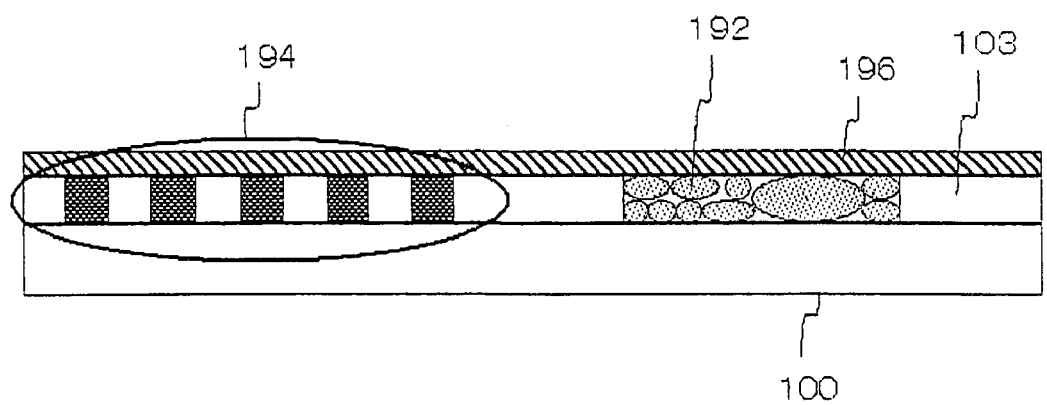
FIG. 10 is a schematic cross-sectional view showing a status of an interconnect in the semiconductor device according to the embodiment, after applying a thermal stress thereto.
Figure 10B:
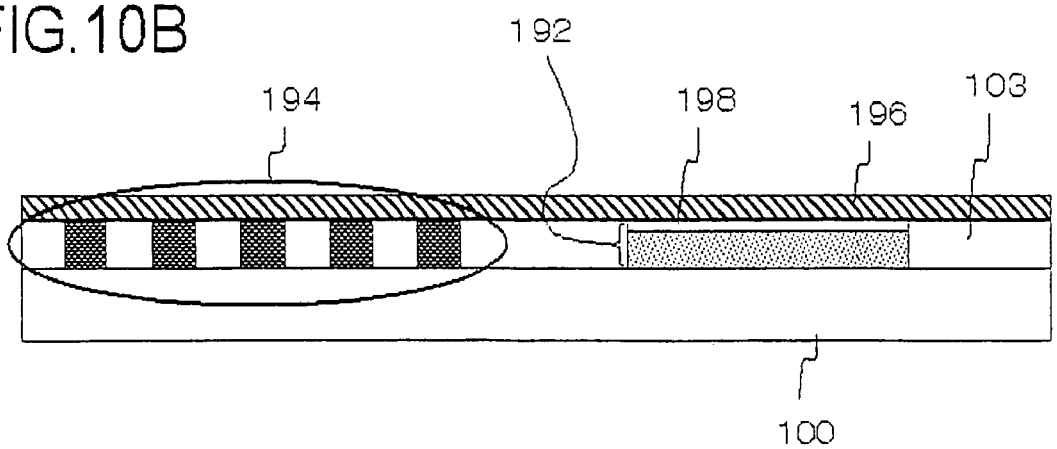

Also, the impurity is not limited to Al, but may be an element having a lower standard electrode potential than Cu, for example Mg, Sn, Si, and so forth. A reason is that it is necessary to form an impurity oxide layer on an upper surface of an interconnect layer in order to restrain an aggregation reaction caused by a heat treatment, as stated referring to FIG. 10B, in which case the impurity has to be more readily oxidizable than Cu (i.e. have a lower standard electrode potential, which is an index showing an electron attracting power, than Cu).

Further, while an impurity concentration of a wide interconnect among the interconnects is indicated as 0.18 wt % (equivalent to 0.42 atomic %) in the first embodiment and 0.25 wt % (equivalent to 0.58 atomic %) in the second embodiment, the impurity concentration is not limited to these values. However, it is preferable to arrange such that an impurity concentration in a wide interconnect among the interconnects remains in a range of 0.1 to 10 atomic %.

Further, while the foregoing embodiments refer to the case where the interconnects are formed in two different widths, the interconnects may be formed in more than two different widths.

It is apparent that the present invention is not limited to the above embodiment, that may be modified and changed without departing from the scope and spirit of the invention.

What is claimed is:

1. A method of manufacturing semiconductor device including an interconnect, comprising:
    forming on a semiconductor substrate an insulating layer in which a wide interconnect trench which is relatively wide and a narrow interconnect trench which is relatively narrow are formed;
    forming a first metal layer in said wide interconnect trench and in said narrow interconnect trench;
    forming by an electrolytic plating method a second metal layer including the same metal as that of said first metal layer, in a in said bottom of wide interconnect trench and in a relatively great thickness in said bottom of narrow interconnect trench;
    forming an alloy layer including the same metal as that of said second metal layer and containing an impurity by a sputtering method on said second metal layer in said wide interconnect trench and in said narrow interconnect trench;
    diffusing said impurity from said alloy layer into said metal layer, so as to form a metal layer having a relatively high impurity concentration in said wide interconnect trench, and a metal layer having a relatively low impurity concentration in said narrow interconnect trench; and
    removing said alloy layer and said metal layer formed in an external region of said respective interconnect trenches, so as to form a relatively wide interconnect in said wide interconnect trench and a relatively narrow interconnect in said narrow interconnect trench, so as to constitute a first interconnect.

2. The method according to claim 1, wherein said step of diffusing said impurity from said alloy layer into said metal layer includes performing a heat treatment for granulating said metals so as to diffuse said impurity.

3. The method according to claim 1, wherein said step of forming a first metal layer in said wide interconnect trench and in said narrow interconnect trench includes performing a sputtering method so as to form a first metal layer in said wide interconnect trench and in said narrow interconnect trench.

4. The method according to claim 1, further comprising:
    forming on said first interconnect an interlayer dielectric layer in which an opening for a via plug is formed;
    filling said opening for a via plug with a first conductive layer so as to form a via plug;
    forming an interlayer dielectric layer in which a second interconnect trench connected to said via plug is provided; and
    filling said second interconnect trench with a second conductive layer so as to form a second interconnect.

5. The method according to claim 4, wherein said first conductive layer is constituted of one selected out of a group consisting of copper containing an impurity other than copper, copper, tungsten, and aluminum.

6. The method according to claim 1, further comprising:
    forming on said first interconnect an interlayer dielectric layer in which an opening for a via plug is formed and a second interconnect trench connected to said opening for a via plug is formed; and
    filling said opening for a via plug and said second interconnect trench with a conductive layer, so as to form a via plug and a second interconnect.

7. The method according to claim 1, wherein said metal is copper.

8. The method according to claim 1, further comprising:
    forming a third interconnect constituted of said metal not containing an impurity, on said first interconnect.

* * * * *